United States Patent [19]

Hwang et al.

[11] Patent Number: 4,681,657
[45] Date of Patent: Jul. 21, 1987

[54] PREFERENTIAL CHEMICAL ETCH FOR DOPED SILICON

[75] Inventors: Bao-Tai Hwang, Poughkeepsie; Wendy A. Orr-Arienzo, Chappaqua, both of N.Y.; Reinhard Glang, Reston, Va.

[73] Assignee: International Business Machines Corporation, Armonk, N.Y.

[21] Appl. No.: 793,402

[22] Filed: Oct. 31, 1985

[51] Int. Cl.$^4$ ............... H01L 21/306; B44C 1/22; C23F 1/02; C03C 15/00
[52] U.S. Cl. ............... 156/657; 156/659.1; 156/662; 252/79.3; 252/79.4
[58] Field of Search ............ 156/657, 647, 659.1, 156/662; 252/79.3, 79.4

[56] References Cited

U.S. PATENT DOCUMENTS

| | | | |
|---|---|---|---|
| 3,997,381 | 12/1976 | Wanlass | 156/3 |
| 4,094,752 | 6/1978 | Vahe | 204/129.95 |
| 4,215,174 | 7/1980 | Flowers | 428/375 |
| 4,345,969 | 8/1982 | James et al. | 156/659.1 |
| 4,372,803 | 2/1985 | Gigante | 156/626 |
| 4,512,875 | 4/1985 | Long et al. | 208/114 |

OTHER PUBLICATIONS

Schwartz and Robbins, "Chemical Etching of Silicon IV. Etching Technology", *J. Electrochem. Soc.*, vol. 123, #12 (12/76), pp. 1903–1909.

Osada, et al, "Crystal Growth & Chemical Preferential Etching in Fabrication of Epitaxial Silicon Detectors", *IEEE Transactions on Nuclear Science*, vol. NS-25, #1 (2/78), pp. 371–377.

Burns et al, "A Doping-Dependent Etch for Silicon Pressure Sensor Fabrication", *Electrochem. Soc. Conf.*, (May 1982) Abstract #121.

Muraoka et al, "Controlled Preferential Etching Technology", *Electrochemical Society Meeting*, May 13–18, 1973.

Wang, "Etching of Germanium and Silicon", *The Sylvania Technologist*, vol. XI, #2, (Apr. 1958), pp. 50–58.

*Primary Examiner*—William A. Powell
*Attorney, Agent, or Firm*—Barbara A. McDowell; Maurice H. Klitzman; T. Rao Coca

[57] ABSTRACT

The present invention provides an improved etchant composition and method for the resistivity specific etching of doped silicon films which overlie intrinsic or lightly doped crystal regions. The composition of the etchant is 0.2–6 mole % hydrofluoric acid, 14–28 mole % nitric acid, and 66–86 mole % acetic acid/water. The etchant leaves no silicon residue and provides for controlled etching with an etch stop at the lightly doped or intrinsic region.

4 Claims, 14 Drawing Figures

PREFERENTIAL CHEMICAL ETCH FOR DOPED SILICON

BACKGROUND OF THE INVENTION

This invention relates to a silicon etch solution and method and more specifically to a silicon etch solution and method which is resistivity specific.

The principles involved in wet etching silicon wafers have been known since the late 1950's. Early interest centered on chemical wafer polishing or on developing etch pits to reveal crystal imperfections. Most widely used were solutions containing HF as a reducing agent, water and acetic acid as moderating or diluting agents, and one or more oxidizers such as $HNO_3$, $H_2O_2$, $Br_2$, and $I_2$. These compositions had very high etch rates of 1 to 40 microns/min. An advantage of these etchants was the smoothness of the resulting wafer surface.

In the 1960's and 1970's, new chemical etchants for silicon were developed which added versatility and variety to silicon etching capabilities. For example, two new anistropic etchant systems, $KOH/H_2O$ and ethylene diamine/pyrochatechol (EDP), were explored for use in the fabrication of micromechanical devices. These etches attack the <100> plane 30 to 400 times faster than the <111> plane. New oxidizers such as $CrO_3$ were added to the HF/acetic acid/water system to reveal defects for the evaluation of epitaxial layers.

Interest in the $HF/HNO_3$/acetic acid/water (HNA) system was renewed to develop etches for mesa diode fabrication where resistivity specific etch rates were desired. In the early 1970's it was reported that an etching solution composed of 1 part HF, 3 parts $HNO_3$, and 8 parts $CH_3COOH$ by volume would etch highly doped (greater than $1 \times 10$ exp $17/cm^3$) single crystal silicon much faster than lightly doped material. The etch rate was 0.7 to 3 micron/min. for silicon having a resistivity of less than 0.01 ohm-cm. When the silicon resistivity was higher than 0.068 ohm-cm, no etching occurred.

During the manufacture of certain semiconductor devices, it is usually necessary to etch a layer or layers of polysilicon which may be doped to various levels. For example, doped polysilicon films are used in the fabrication of VLSI chips where they may serve as gate electrodes for FET structures, as polysilicon base or emitter regions in bipolar devices, or as resistors. In every case, the use of polysilicon films is predicated on the ability to etch line patterns with high resolution and sharply defined edges. Various methods of plasma etching are commonly employed to form resist-defined patterns in polysilicon films. Directional ion etching gives excellent line resolution and edge definition. Furthermore, since the polysilicon film patterns to be etched may include $SiO_2$ films which are partly exposed to the etch, an anisotropic plasma etch will prevent undercutting in the $SiO_2$ region. However, in fabricating bipolar devices with a polysilicon base, the polysilicon film has to be removed from the region of the future emitter. This requires a reasonably high etch rate for the doped polysilicon film and either no attack or at least a very slow etch rate of the silicon crystal underneath. No plasma or ion etch method is presently known which satisfies such an "etch stop" requirement. Additionally, ion etching introduces a certain amount of surface damage which is generally detrimental to the characteristics of semiconductor devices made in such damaged regions. An example of the surface obtained when RIE is used to etch doped polysilicon overlying an intrinsic or lightly doped surface is shown in FIG. 1. The unevenness of the surface is a result of the lattice damage which has occurred. A further problem with plasma etching is that the etchants attack the walls of the stainless steel chamber, causing nickel and iron to enter the etch atmosphere. These elements can then inbed in the wafer and result in device leakage.

With these considerations in mind, a wet chemical etch could offer significant advantages in the fabrication of certain types of semiconductor devices. HNA in a 1:3:8 volume ratio is unsuitable for this purpose because of its extremely high etch rate. Its etch rate in doped polysilicon is as high as 350 Angstroms/sec and, therefore, it does not lend itself very well to controlled etching of thin films. The result is incomplete etching if the process is interrupted too early or severe undercutting if the time limit is exceeded. Diluting the etchant with water or acetic acid slows the etch rate, but results in spotty surfaces due to polysilicon residue. A second etch solution has been used to achieve a specular surface, but this results in an additional step which is undesirable because of the additional level of process control required and because of the additional possibility of contamination of the wafers in the second etch bath.

SUMMARY OF THE INVENTION

Accordingly, it is an object of this invention to improve the etchant and method for etching doped silicon.

It is another object of this invention to improve the etchant and method for the resistivity specific etching of doped silicon.

It is another object of this invention to etch doped silicon films at an etch rate low enough to allow for process control.

It is a further object of this invention to etch doped silicon without leaving silicon residue, creating a clean specular crystal surface that lends itself to further device processing.

It is another object of this invention to etch doped silicon much faster than $SiO_2$.

The present invention provides an improved etchant composition and method for the resistivity specific etching of doped silicon films which overlie intrinsic or lightly doped crystal regions. The composition of the etchant is 0.2–6 mole % hydrofluoric acid, 14–28 mole % nitric acid, and 66–86 mole % acetic acid/water. The etchant leaves no silicon residue and provides for controlled etching with an etch stop at the lightly doped or instrinsic region.

DESCRIPTION OF THE PREFERRED EMBODIMENTS

1. Terminology

Figure 1:
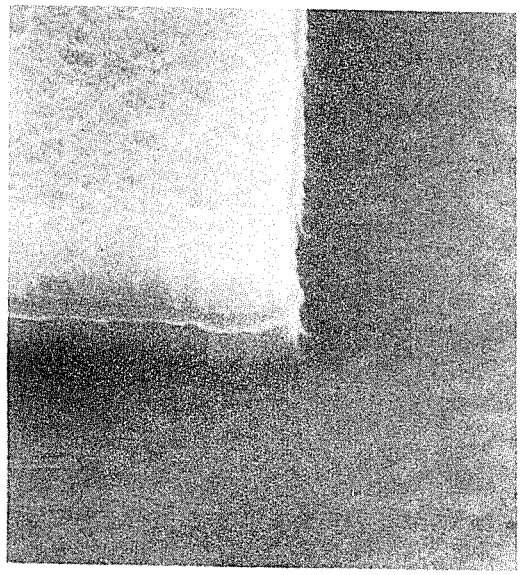
FIG. 1 is a SEM at 10,000× magnification of a surface obtained when RIE is used to etch doped polysilicon overlying an intrinsic or lightly doped surface.

Doped or highly doped: Doping levels in excess of 10 exp 18 atoms/cm$^3$.

Lightly doped: Doping levels less than 10 exp 16 atoms/cm$^3$.

Clear and Specular: Featureless up to a magnification of 10,000×.

Resistivity specific: A property of etchants whereby silicon within a given resistivity range is etched much faster than silicon within a different resistivity range. For any given silicon, this property can be correlated to doping level. (See FIG. 2)

2. Preparation and Use of the Etchant

The etchant according to the present invention was prepared using 49% aqueous hydrofluoric acid, 70% aqueous nitric acid, and 99% acetic acid as the starting reagents. The compositions were prepared using volume ratios and were constantly stirred during preparation. The stirring can be ultrasonic or a magnetic stirrer may be used. The hydrofluoric acid was placed in the mixing container first, then the nitric, and finally the acetic. The water portion of the etchant came from the aqueous portions of the acids. For the preferred composition according to the present invention, 1 volume part of HF was placed in the mixing container and to that were added 50 volume parts of nitric and 100 volume parts of acetic acid, respectively. The shelf life of the etchant should be equal to that of the acids used.

The wafers processed according to this invention were etched by immersing them in a constantly stirred bath of the etchant. All experiments were done at room temperature. Data on the temperature dependence of the etch rate or preferential etch properties were not obtained. However, satisfactory results should be obtained within the interval of 20–30 degree C. Stirring can be ultrasonic or by means of a magnetic stirrer. Alternatively, flow-through agitation or a spray-type etcher could be used. During use, the life of the etchant will be dependent on the quantity of wafers processed.

3. Description of the Test Wafers

The following description of the test wafers can best be understood by reference to FIG. 5.

Underlying substrate 11 was single crystal silicon having a <100> orientation, but <111> orientation could also be used. Substrate 11 was doped with arsenic to a level of 10 exp 16 atoms/cm$^3$, although any level up to 10 exp 18 atoms/cm$^3$ could be used. Thermal oxide 12 was grown at 900 degrees C. in oxygen, HCl and steam in a dry/wet/dry cycle to a thickness of 1000 Angstroms, but could be thermally grown by any of various known methods. After deposition of thermal oxide 12 a resist mask which exposed the bottom third of the wafer was created. Thermal oxide 12 was then removed from the bottom third of the wafer with dilute HF and the resist was stripped. (See FIG. 5A).

Next 3100 Angstroms of in situ doped polysilicon 13 was deposited by the thermal decomposition of silane with a boron-containing gas at 625–650 degrees C. (See FIG. 5B.) The uniformity of this layer was ±6% and the doping level was greater than or equal to 10 exp 19 atoms/cm$^3$ as measured with secondary ion mass spectroscopy (SIMS). The resistivity was measured with a four-point probe and was 0.4 ohm-cm. Both arsenic and phosphorus doped polysilicon have also been used. After deposition of polysilicon 13 resist was deposited, exposed and developed to open a window across the middle third of the wafer. (See FIG. 5C). Polysilicon 13 was removed from this portion of the wafer with a CF$_4$ RIE etch, thermal oxide 12 was removed with dilute HF, and the resist was stripped.

Figure 6A:
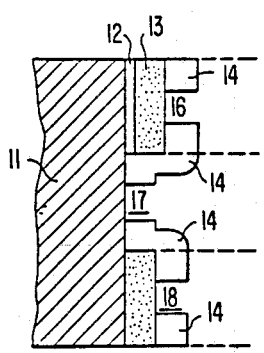
FIGS. 6A and 6B show the final layout of the test wafer.
Figure 6B:
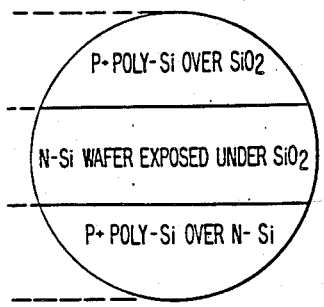

Finally, 3000 Angstroms of low temperature/low pressure CVD silicon dioxide 14 was deposited at 435 degrees C. (See FIG. 5D.) A final resist mask was deposited and three windows were opened in the CVD oxide, one over each third of the wafer. (See FIG. 5E.) The CVD oxide lying beneath these windows was etched away with buffered HF and the resist was stripped. Therefore, the upper third of the wafer had a window 16 exposing doped polysilicon 13 overlying thermal oxide 12, the middle third of the wafer had a window 17 exposing the single crystal substrate 11, and the bottom third of the wafer had a window 18 exposing doped polysilicon 13 overlying single crystal substrate 11. (see FIGS. 6A and 6B.) The wafer was divided into strips and each strip was etched for a different amount of time.

4. Etch Rate Measurements

Figure 7A:
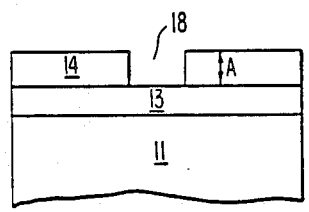
FIGS. 7A and 7B show the method of determining the thicknesses of CVD oxide and doped polysilicon etched.
Figure 7B:
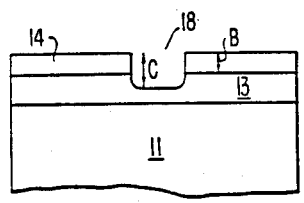

The initial thickness of the low temperature silicon dioxide was measured optically using either interferometry or ellipsometry (thickness A in FIG. 7A). After etching, the remaining low temperature silicon dioxide was measured the same way (thickness B in FIG. 7B). The step in the silicon dioxide and polysilicon was measured with a profilometer (thickness C in FIG. 7B). By subtracting thickness B from thickness C the amount of polysilicon etched was determined. Dividing this number by the etch time gave the etch rate. These measurements were performed on the bottom third of the wafer.

The upper third of the wafer was used to study the selectivity of the etchant to doped polysilicon overlying thermal oxide. The middle third of the wafer was used to determine the amount of attack on the underlying intrinsic or lightly doped substrate.

The resist used for the various processing steps can be an optically exposed AZ type or it can be an E-beam type, processed according to standard techniques. The resist should be baked and/or plasma hardened after exposure and development to ensure that the integrity of the resist mask will be maintained during etching. Likewise, the thickness of the resist should be such that it will withstand processing. A thickness of approximately 10,000 Angstroms was used on the wafers processed.

5. Experiments and Results

Figure 8:
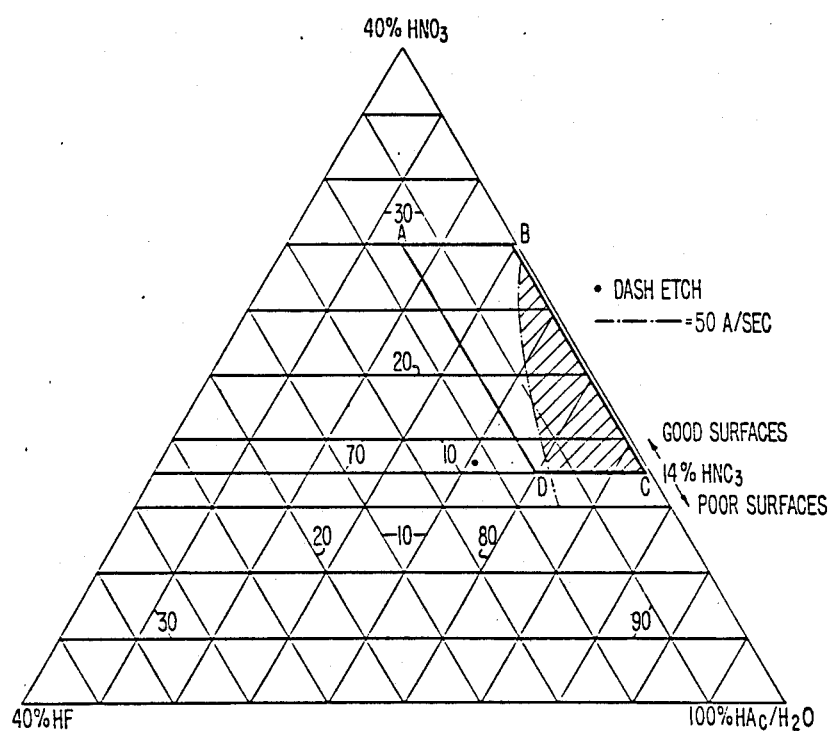
FIG. 8 shows the region of interest of the phase diagram of the HNA family of etches.

In general terms, the concentration dependent properties of HNA etches may be discussed using a ternary phase diagram. FIG. 8 shows the region of interest (A-B-C-D) of the phase diagram of the HNA family of etches. One vertex represents the mole percent of hydrofluoric acid to a maximum of 40%, another that of nitric acid to a maximum of 40%, and the third the sum of acetic acid and water to a maximum of 100%. The shaded region of the phase diagram represents those compositions capable of preferentially etching doped polysilicon films without leaving a polysilicon residue, but having etch rates less than 50 Angstroms/sec to allow for process control in accordance with the preferred embodiments of the present invention.

Initial attempts to produce a slower resistivity specific etch consisted of diluting the 1:3:8 HNA etch (Dash etch) with acetic acid while maintaining the molecular ratio of the oxidizing agent ($HNO_3$) to the reducing agent (HF) at a constant value of 1.61 as in Dash etch. Whereas dilution did reduce the etch rate as expected, it also had undesirable side effects. The etchant was too preferential and failed to etch the higher doped polysilicon at the interface between the polysilicon layer and the underlying intrinsic or lightly doped surface. This resulted in a polysilicon residue remaining after etch. Not only was the etching non-uniform, the solutions were plagued by variable incubation periods before the onset of etching. This resulted in variation in the time required to remove polysilicon films of constant thickness. The result of these experiments is summarized in Table I.

TABLE I

| COMPOSITION (MOLE %) | | | | Etch Rate | |
|---|---|---|---|---|---|
| HF | $HNO_3$ | HAc | $H_2O$ | (Ang/sec) | Surface |
| 9.02 | 14.53 | 42.82 | 33.63 | 350 | specular |
| 4.25 | 6.83 | 40.26 | 48.67 | 20 | spotty |
| 8.34 | 13.43 | 54.70 | 25.53 | 220 | spotty |
| 7.75 | 12.49 | 64.90 | 14.85 | 150 | spotty |
| 4.20 | 6.78 | 73.71 | 15.33 | 18 | spotty |
| 7.25 | 11.67 | 73.77 | 7.31 | 65 | spotty |

Figure 2:
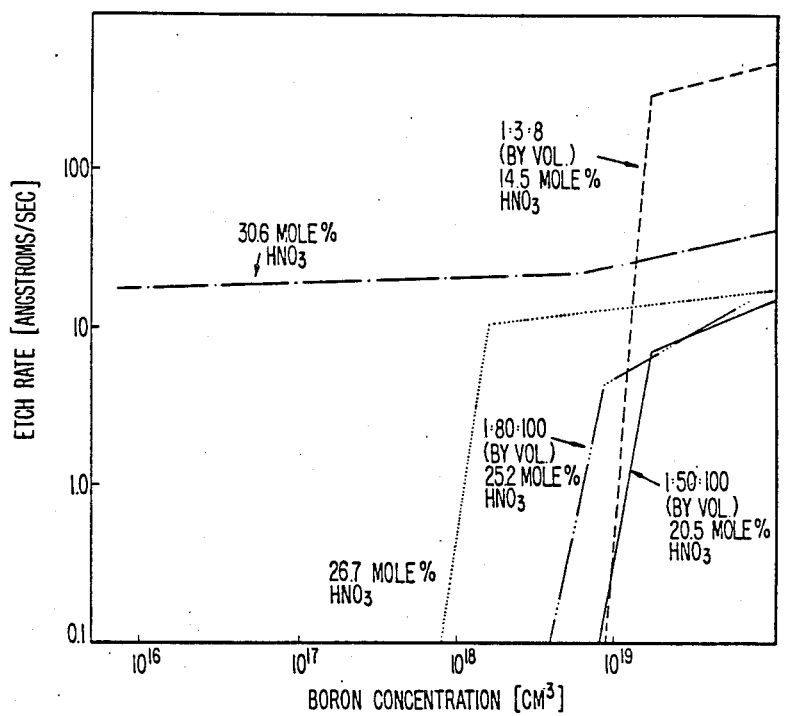
FIG. 2 is a log-log graph of etch rate (in Angstroms/sec) versus boron doping concentration (in atoms/$cm^3$) showing the etch rates of various HNA solutions as functions of boron concentration in polysilicon.
Figure 3:
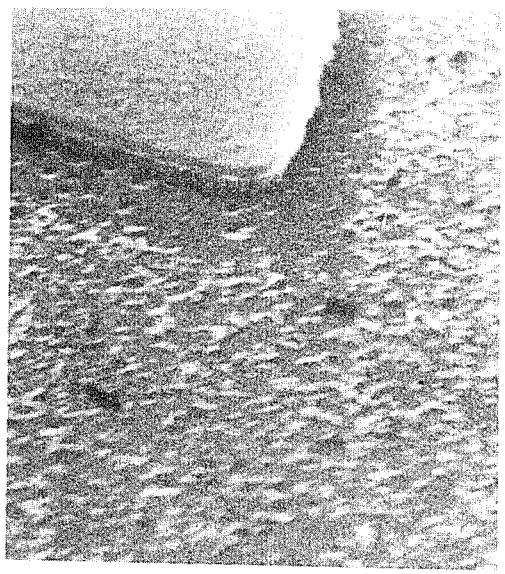
FIG. 3 is a SEM at 10,000× magnification of a surface obtained after a composition of 4.25 mole % HF, 6.8 mole % nitric acid, and 40.26 mole % acetic acid is used to etch doped polysilicon overlying an intrinsic or lightly doped surface.
Figure 4:
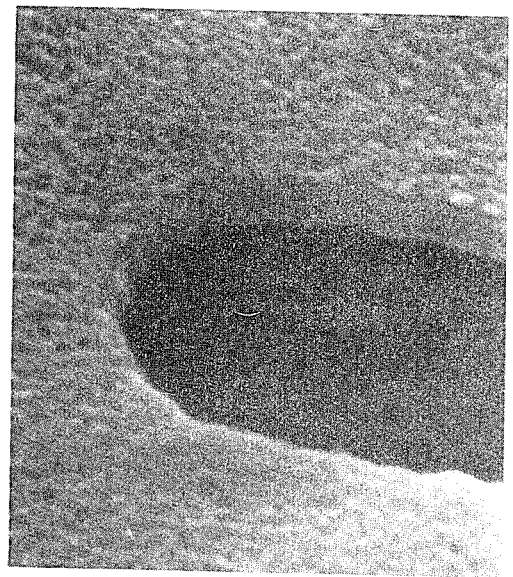
FIG. 4 is a SEM at 15,000× magnification of a surface obtained after the preferred composition of the present invention is used to etch doped polysilicon overlying an intrinsic or lightly doped surface.
Figure 5A:
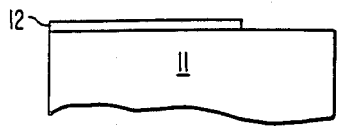
FIGS. 5A through 5E show the preparation of the test wafer used.
Figure 5B:
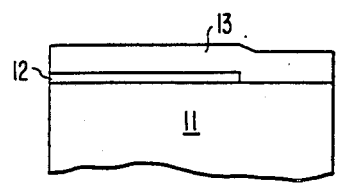
Figure 5C:
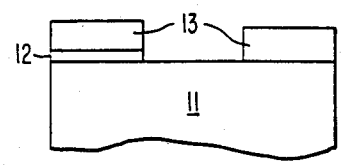
Figure 5D:
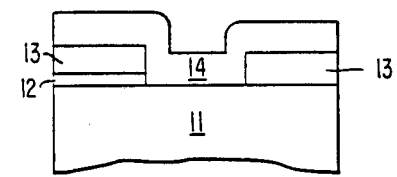
Figure 5E:
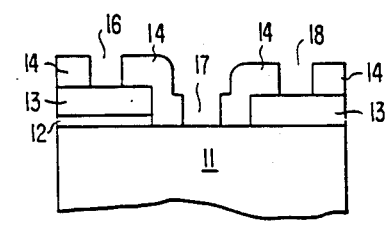

The search for a slow, selective etch was broadened to include compositions whose molecular ratio of oxidizer to HF was greater than 1.61. Etchants were obtained having moderately low, reproducible etch rates of polysilicon films without incubation periods as well as clean, specular crystal substrate surfaces. Repeated experiments with a wide range of etchant compositions have shown a compositional boundary at approximately 14 mole percent nitric acid. As shown on the phase diagram of FIG. 8, etch compositions lying above this line are characterized by uniformly smooth substrate surfaces, whereas those below it are non-uniform leaving polysilicon residues. FIG. 3 is a SEM of a surface after etching with a composition having a mole percent of nitric acid less than 14 mole %, while FIG. 4 is a SEM of a surface after etching with a composition having a mole percent of nitric acid greater than 14 mole %. Also shown on the phase diagram of FIG. 2 is a line defining etch compositions having an etch rate of 50 Angstroms/sec. This is shown on the phase diagram as _ _ _ _ _ _ _. Compositions to the left of this line have etch rates above 50 Angstroms/sec and compositions to the right of this line have etch rates less than 50 Angstroms/sec.

Systematic tests were performed on several etches lying within the shaded region of the phase diagram of FIG. 8. The compositions and characteristics of some of the specific compositions tested are presented in Table II. All etch rates have been verified to be uniform and reproducible across photolithographically patterned wafers. SEM analysis of the substrate surfaces has shown them to be specular and clear.

TABLE II

| COMPOSITION (MOLE %) | | | | Etch Rate | |
|---|---|---|---|---|---|
| HF | $HNO_3$ | HAc | $H_2O$ | (Ang/sec) | Surface |
| 0.5 | 14.0 | 62.5 | 24.0 | 2.0 | clear, specular |
| 0.59 | 25.2 | 35.0 | 39.0 | 10.0 | clear, specular |
| 0.76 | 20.5 | 45.3 | 33.4 | 7.3 | clear, specular |
| 1.6 | 17.0 | 52.0 | 29.0 | 10.8 | clear, specular |
| 2.0 | 15.0 | 56.3 | 26.7 | 9.3 | clear, specular |

The preferred etch composition according to the present invention is the third composition of Table II and is 1 part HF, 50 parts nitric acid, and 100 parts acetic acid by volume using the starting reagents specified above. This corresponds to 0.76 mole % HF, 20.5 mole % nitric acid, 45.3 mole % acetic acid, and 33,4 mole % water. This composition has an etch rate of 7.3 Angstroms/sec for doped polysilicon. For etchants according to the present invention, polysilicon etch rates which lie in the 7 to 12 Angstrom/sec range are at least 25 times faster than that of the lightly doped substrate giving excellent selectivity. The etch rate of the preferred composition allows a 3100 Angstroms film of doped polysilicon to be removed in 7½ minutes which is slow enough for process control. Other compositions might be preferred for applications involving thicker or thinner doped polysilicon films. For thin films (i.e. approximately 3000 Angstroms or less), etch compositions would probably be chosen from the region lying to the right of the 50 Angstroms/sec line on the phase diagram of FIG. 8. Thicker films would allow the use of compositions lying to th left of the 50 Angstroms/sec line.

6. Applications

The etchant according to the present invention can be used in any application requiring the removal of a highly doped polysilicon layer overlying intrinsic or lightly doped silicon. The intrinsic or lightly doped silicon need not be single crystal silicon, it can be intrinsic or lightly doped polysilicon. The particular composition chosen will be a function of the thickness of the polysilicon to be removed, and will allow a suitable etch rate for process control purposes. The etchant can also be used in applications where the underlying layer is silicon dioxide or silicon nitride or where a silicon dioxide or silicon nitride layer is otherwise exposed to the etchant for limited times.

An additional use for the etchant relates to electron microscopy. In making cross-sections of silicon device structures, it is often desirable to examine the spreading of diffused impurities. As shown in FIG. 2, the preferred composition according to the present invention displays a sharp decrease in etch rate at a doping level of approximately 10 exp 19 atoms/$cm^3$. Iso concentration lines can be delineated by exposing cross-sections to the etchant. Since the etchant is specific to doping level or resistivity regardless of type of dopant, even n regions which abut n+ regions or p regions which abut p+ regions can be marked. This information is important in designing processes for silicon device structures.

While the invention has been particularly shown and described with reference to the preferred embodiments, it will be understood by those skilled in the art that various changes in form and detail may be made without departing from the spirit and scope of the invention. As noted above, the etchant can be used for any application requiring the preferential removal of a highly doped silicon layer overlying a lightly doped or intrinsic layer. The thicknesses and arrangements of the various layers and the makeup of the substrate may vary from application to application.

We claim:

1. A method for the controllable, preferential patterned etching of a doped silicon layer which overlies an intrinsic or lightly doped crystal surface which comprises the steps of:
   providing an etch mask overlying the silicon layer;
   immersing the doped silicon on the crystal surface in an etchant solution comprising about 0.2-6 mole percent hydrofluoric acid, 14-28 mole percent nitric acid, and 66-86 mole percent acetic acid/water; and
   etching portions of the doped silicon layer exposed through the mask in the solution until the exposed doped silicon is removed and the underlying surface is clear and specular.

2. A preferential etchant for etching a doped silicon layer which overlies an intrinsic or lightly doped crystal surface, the etchant comprising 0.2-6 mole percent hydrofluoric acid, 14-28 mole percent nitric acid, and 66-86 mole percent acetic acid/water.

3. A preferential etchant according to claim 2 for etching a doped silicon layer which overlies an intrinsic or lightly doped crystal surface, the etchant comprising compositions within the shaded region of FIG. 8.

4. The etchant of claim 3 comprising about 0.76 mole percent hydrofluoric acid, 20.5 mole percent nitric acid, 45.3 mole percent acetic acid, and 33.4 mole percent water.

* * * * *